(12) United States Patent
Suzuki

(10) Patent No.: US 6,373,777 B1
(45) Date of Patent: Apr. 16, 2002

(54) SEMICONDUCTOR MEMORY

(75) Inventor: Misao Suzuki, Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 09/858,761

(22) Filed: May 15, 2001

Related U.S. Application Data

(63) Continuation of application No. 09/352,717, filed on Jul. 13, 1999, now abandoned.

(30) Foreign Application Priority Data

Jul. 14, 1998 (JP) .............................. 10-199110

(51) Int. Cl.⁷ .............................. G11C 8/00; G11C 5/06
(52) U.S. Cl. .................................... 365/230.03; 365/63
(58) Field of Search ...................... 365/230.03, 230.05, 365/230.06, 233, 189.05, 205, 207, 208, 63

(56) References Cited

U.S. PATENT DOCUMENTS

| | | | | |
|---|---|---|---|---|
| 5,313,431 A | * | 5/1994 | Uruma et al. .......... | 365/230.05 |
| 5,343,425 A | * | 8/1994 | Saito ..................... | 365/230.03 |
| 5,566,124 A | * | 10/1996 | Fudeyasu et al. ...... | 365/230.06 |
| 5,796,671 A | * | 8/1998 | Wahlstrom ............. | 365/230.03 |
| 5,844,856 A | * | 12/1998 | Taylor ................... | 365/230.03 |
| 5,953,257 A | * | 9/1999 | Inoue et al. ........... | 365/189.05 |
| 6,144,587 A | * | 11/2000 | Yoshida ................. | 365/189.05 |

FOREIGN PATENT DOCUMENTS

| | | |
|---|---|---|
| JP | 3-19188 | 1/1991 |
| JP | 9-115282 | 5/1997 |
| JP | 9-223394 | 8/1997 |
| JP | 10-92177 | 4/1998 |
| JP | 10-302470 | 11/1998 |
| JP | 11-86559 | 3/1999 |

OTHER PUBLICATIONS

Copy of Japanese Patent Office Action for counterpart foreign application. English Translation of Selected Portions of Japanese Patent Office Action as explanation of relevance.

* cited by examiner

*Primary Examiner*—Trong Phan
(74) *Attorney, Agent, or Firm*—Darryl G. Walker

(57) ABSTRACT

According to disclosed embodiments, a semiconductor memory is disclosed that includes a memory array connected to a number of registers by a transfer bus of reduced size. Reduction of transfer bus size can be achieved without a significant increase in data processing speed. According to one embodiment (300) a semiconductor memory can include a number of cell regions (302-0 and 302-1) arranged in a first direction. Sense amplifier banks (304-0 to 304-2) are connected to the cell regions (302-0 and 302-1) and a transfer bus (310-0/1) is disposed over the cell regions (302-0 and 302-1) in the first direction. The transfer bus (310-0/1) includes switching circuits (312-0 and 312-1) corresponding to each cell region (302-0 and 302-1). The switching circuits (312-0 and 312-1) can divide the transfer bus (310-0/1) into a number of transfer bus line portions (314-0/1, 316-0/1 and 318-0/1).

20 Claims, 6 Drawing Sheets

SEMICONDUCTOR MEMORY

This application is a continuation of patent application Ser. No. 09/352,717 filed Jul. 13, 1999, abandoned.

TECHNICAL FIELD

The present invention relates generally to semiconductor memories, and more particularly to a semiconductor device having two memory portions that are connected by a transfer bus of reduced size.

BACKGROUND OF THE INVENTION

Many computer systems can include a main memory. In order to maintain reasonable costs in such computer systems, main memories are typically composed of dynamic random access memories (DRAMs). DRAMs can be fabricated in a variety of configurations and sizes. In the past, general purpose (asynchronous) DRAMs could provide sufficient speed at a low enough cost to be used in a main memory.

More recently, however, computer operating speeds have begun to outpace the speed of general purpose DRAMS. In particular, processor speeds have outpaced the data transfer rates of general purpose DRAMs. To alleviate the disparities in processor rates and general purpose DRAM data transfer rates, many systems have employed a substorage device situated between a main memory and a processor. Such substorage devices are typically referred to as "cache" memories. A cache memory is typically a high-speed memory device, such as a static RAM (SRAM) or an emitter coupled logic bipolar RAM (ECLRAM), to name just a few examples. A cache memory can be integrated into a processor, or may be provided external to the processor.

Another variation in memory devices combines DRAMs and high speed cache-type RAMs on the same device. Such combination devices have been utilized in computer workstations and some personal computers. Such devices can include a main storage formed from a DRAM and a cache memory formed from a SRAM. Both the DRAM and SRAM are formed on the same semiconductor substrate. Such devices have been referred to as cache DRAMs or CDRAMs.

CDRAMs can be arranged to transfer data between the DRAM and SRAM portions in a bidirectional fashion. When a memory is accessed, if the requested data location is in the SRAM portion, the access can be considered a cache "hit." If a requested data location is not in the SRAM portion, the access can be considered a cache "miss." The requested data can then be retrieved from the DRAM. A drawback to conventional CDRAMs is that cache misses can introduce some delay into a data transfer operation.

Another drawback to such CDRAMs is the number of external pins that are utilized in such devices (pin count). Because the DRAM portion and SRAM portion have their own respective address pins, the number of pins on a CDRAM can be much larger than those of a conventional DRAM. Therefore, a CDRAM device is not easily utilized with typical DRAM controllers.

Yet another problem associated with conventional CDRAMs is the amount of area that may be needed to realize a data transfer circuit. Because the area available for such circuits can be limited, the number of transfer bus lines between a DRAM and SRAM portion can also be limited.

Due to the above constraints, the number of data bits that can be transferred at the same time between a DRAM portion and a SRAM portion on a CDRAM can be limited. Further, many conventional CDRAM approaches avoid placing transfer lines in the same area as column select lines. As a result, the number of transfer lines can further be limited by the width of such available areas. As a general rule, the smaller the number of bits that can be transferred between DRAM and SRAM portions, the lower hit rate of the cache. One skilled in the art would recognize that lower cache hit rates leads to slower overall data access operations for a CDRAM.

The current applicant has previously proposed a "virtual channel" memory. In particular, a virtual channel synchronous DRAM (VCSDRAM) has been disclosed in Japanese Patent Publication No. Hei 11-86559 that can increase the access speed of a SDRAM.

The above-described VCSDRAM can include a memory array of DRAM cells arranged into rows and columns. In addition to the memory array, the VCSDRAM can include a register array having a number of rows and columns. The number of rows and/or columns in the register array can be some ratio of the number of rows and/or columns in the memory array. The register array can provide a cache function in the row and or column directions, and can include SRAM cells.

The above-described VCSDRAM can have a number of applications. One particular advantageous application of a VCSDRAM is the storing and/or displaying of video data. Data can be stored within a memory cell as picture elements (pixels). Pixel data can then be read out in a successive fashion from the same region of the memory array. The pixel data can be amplified by a sense amplifier group corresponding to the memory array region. Particular sense amplifiers can then be selected to transfer data to the channel register by way of a transfer bus.

Referring now to FIG. 6, a VCSDRAM, such as that referred to above, is illustrated in a block diagram. The VCSDRAM is designated by the general reference character 600, and is shown to include two cell regions, designated as 602-0 and 602-1. The cell regions (602-0 and 602-1) can include a number of memory cells connected to digit lines, one of which is shown as 604. As just one arrangement, the digit lines can be connected to memory cells in a column-wise direction.

A number of sense amplifiers, one of which is shown as item 606, are situated adjacent to both cell regions (602-0 and 602-1). Sense amplifier 606 (and those sense amplifiers within its group) can be considered "cornmon" to both cell regions (602-0 and 602-1). At the other end of cell region 602-0 is another group of sense amplifiers, one of which is shown as item 608. Further, at the other end of cell region 602-1 is a third group of sense amplifiers, one of which is shown as item 610. In the arrangement of FIG. 6, sense amplifier 608 (and those sense amplifiers within its group) is dedicated to cell region 602-0, and sense amplifier 610 (and those sense amplifiers within its group) is dedicated to cell region 602-1.

The VCSDRAM 600 further includes a number of registers 614-0 to 614-2 disposed at one end of the cell regions (602-0 and 602-1). The registers (614-0 to 614-2) can be connected to the various sense amplifier groups by transfer bus lines, shown as 616-00 to 616-21. Connections between the sense amplifiers and their associated transfer bus lines (616-00 to 616-21) can be conventional in nature, and are not shown in particular in FIG. 6.

For example, transfer bus lines 616-20/21 can transfer data from sense amplifier 606, 608 or 610 to channel register 614-2. That is, one sense amplifier group can be activated, and thereby place data on the transfer bus lines (616-00 to 616-21) and into registers (614-0 to 614-2). Data stored in registers (614-0 to 614-2) can be transferred to external locations according to channel read and channel write commands.

In the arrangement of FIG. 6, signals SSU1, SSU2, SSM1, SSM2, SSD1 and SSD2 indicate sense amplifier selection signals. Sense amplifier selection signals can be applied to sense amplifier groups by way of select lines, shown as 618-00/01, 618-10/11, and 618-20/21. In the arrangement of FIG. 6, sense amplifier groups can be conceptualized as including "even" sense amplifiers that alternate with "odd" sense amplifiers. Accordingly, select signal SSU1 can select even sense amplifiers from the group that includes sense amplifier 608, and select signal SSU2 can select odd sense amplifiers. Along these same lines, select signal SSM1 can select even sense amplifiers and SSM2 can select odd sense amplifiers from the group that includes sense amplifier 606, and select signal SSD1 can select even sense amplifiers and SSD2 can select odd sense amplifiers from the group that includes sense amplifier 610.

Referring once again to FIG. 6, when the SSU1 signal is activated, sense amplifier 608 can place data on transfer lines 616-20/21. However, if the SSU2 signal is activated, the sense amplifier to the left of sense amplifier 608 can place data on transfer lines 616-20/21. Data on transfer lines 616-20/21 can be stored in channel register 614-2.

It can be understood from the above description that in the arrangement of FIG. 6, when a cell region (such as 602-0 or 602-1) is accessed, data from one of four sense amplifiers will be placed on a given transfer line. In particular, in FIG. 6, when cell region 602-0 is accessed, data will be placed on transfer lines 616-20/21 according to whether select signal SSU1, SSU2, SSM1 or SSM2 is activated.

A drawback to the arrangement of FIG. 6 is that a pair of transfer lines (616-00/01 to 616-20/21) is provided for every two sense amplifiers in a row. It may be difficult and/or inefficient to form transfer lines with such a periodicity (i.e., pitch).

Another drawback to the arrangement of FIG. 6 is that for speed and/or power purposes, the data signal carried on transfer lines (616-00 to 616-21) can have a relatively small amplitude. Consequently, to minimize disturbing such a data signal it may be necessary in some cases to employ shielding conductors 620. Shielding conductors 620 can reduce "crosstalk" between adjacent transfer line pairs (616-00/01 to 616-20/21). Accordingly, the use of such shielding conductors can further increase line pitch, as three lines are provided for every two sense amplifiers in a row.

As semiconductor manufacturing processes advance, it can be possible to decrease device sizes, resulting in reductions in storage device (such as memory cells and registers) and sense amplifier size. However, it may not always be possible to reduce conductive line ("wire") size, particularly if the conductive line is formed from a higher level of metallization. As a result, while device sizes decrease, structures that include a number of conductive lines may not scale down correspondingly. This may be particularly true for buses, such as a transfer bus in a memory device like a VCSDRAM.

It would be desirable to provide a semiconductor device that includes two memory portions (such as a DRAM and SRAM portion) joined by a transfer bus having a decreased number of transfer bus lines. It would also be desirable for such a reduced-bus size semiconductor device to maintain a relatively high data transfer rate. It would be further desirable for such a semiconductor device to be a VCSDRAM.

SUMMARY OF THE INVENTION

An object of the present invention to provide a semiconductor device having a first memory portion connected to a second memory portion with a transfer bus having a reduced number of bus lines. Even with such a reduced bus size, the semiconductor device can maintain a relatively high data processing speed for image processing, or the like.

To achieve the above-mentioned object, a semiconductor memory according to one embodiment of the present invention can include a memory cell array having a number of cell regions disposed in a first direction, sense amplifiers corresponding to each cell region, and a transfer bus extending in the first direction over the cell regions. The transfer bus can include a number switch circuits, each switch circuit corresponding to a cell region. The switch circuits can divide the transfer bus into a number of transfer bus portions.

In the above-described arrangement it can be possible to transfer data on multiple transfer bus portions created by dividing the transfer bus. In this way the efficiency of the transfer bus can be improved without increasing the overall number of transfer bus lines. Further, the number of registers (i.e., the size of second memory portion) can be increased.

In particular, one transfer bus (divided by a switch circuit) can be shared by channel registers. This can allow the number of registers to be doubled while maintaining essentially the same data processing speed.

It is understood that while the present invention may be advantageously employed in a virtual channel synchronous dynamic random access memory (VCSDRAM), the invention should not be construed as being limited to such a particular application. Further, the various general portions described, such as a transfer bus, register and memory cell region, should not be limited. Structures for other conventional semiconductor memories can be used for these portions.

In a preferred arrangement, channel registers are situated at both ends of a transfer bus. In this way, each channel register can transfer data to and from a memory cell via a transfer bus portion.

Also in a preferred arrangement, a transfer bus can include a transfer bus line divided into a number of transfer bus line portions. A sense amplifier group can be associated with each transfer bus line portion. Data can be placed on a transfer bus line portion by activating one sense amplifier of the corresponding sense amplifier group.

Furthermore, in a preferred arrangement, switching circuits are turned off before a memory cell in a corresponding memory cell array is selected. This operation can reduce interference between multiple memory cell arrays.

Furthermore, in a preferred arrangement, a group of sense amplifiers can be common to two memory cell arrays. The group of sense amplifiers can be situated between its corresponding arrays, reducing the space consumed by the group of sense amplifiers.

Furthermore, in a preferred arrangement, a switching circuit can have a number of switch banks, a memory array can have a number of array banks, and the channel registers can be arranged into a number of channel register portions. The switching circuit can be turned off in response to a number of commands. Two such commands include a prefetch instruction which can transfer data from a sense amplifier to a channel register, and a restore command that can transfer data from a channel register to a sense amplifier. In such an arrangement, data can be transferred from multiple array banks to corresponding multiple channel register portions over transfer bus portions created by the switch banks.

DETAILED DESCRIPTION OF THE EMBODIMENTS

Various embodiments of the present invention will now be described with reference to a number of drawings.

Figure 1:
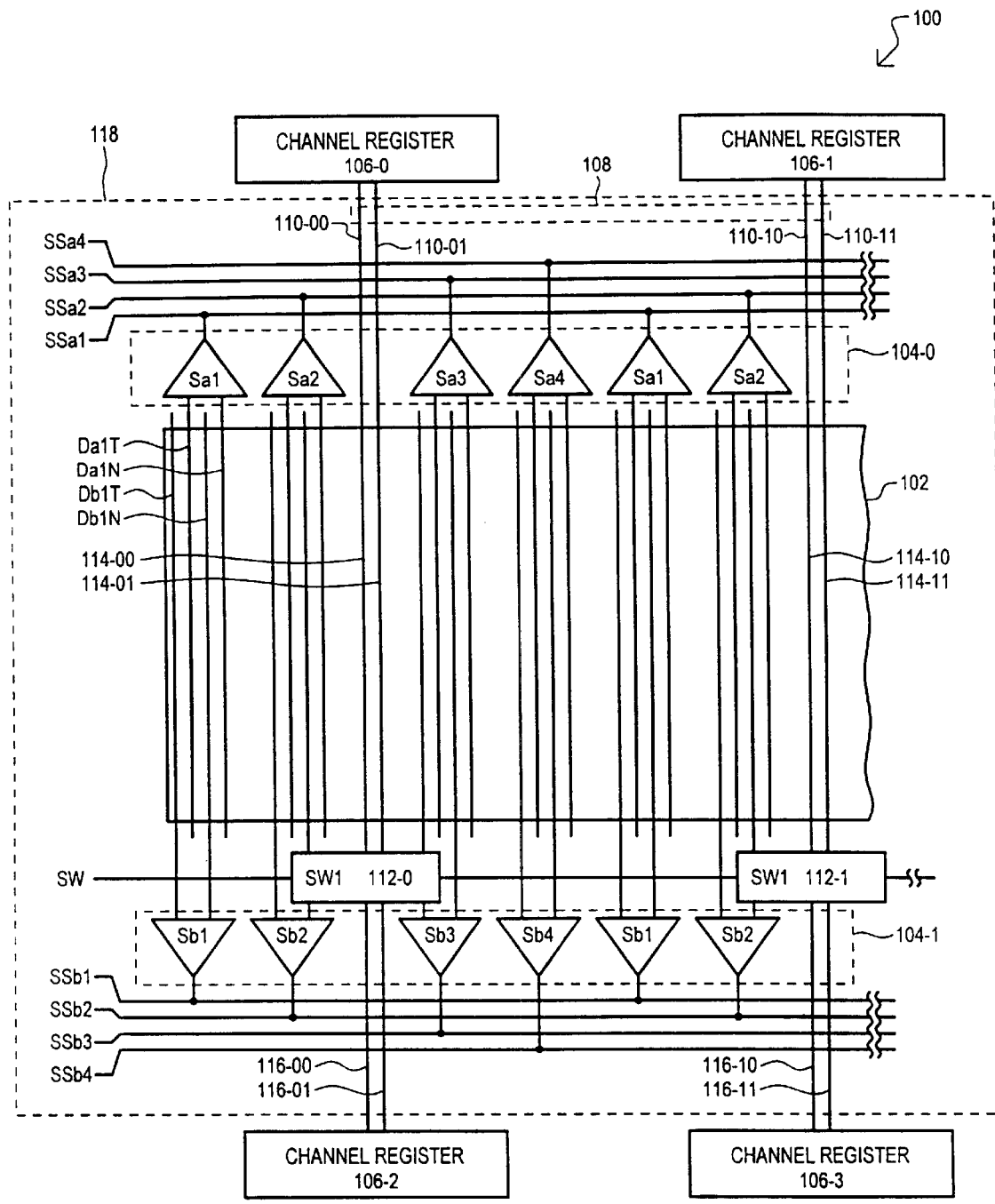
FIG. 1 is a block diagram of a semiconductor memory according to a first embodiment.

FIG. 1 is a block diagram of a semiconductor memory according to a first embodiment. The first embodiment is designated by the general reference character 100 and is shown to include a cell region 102, and the surrounding vicinity. A first sense amplifier bank 104-0 is situated on one side of cell region 102, while a second sense amplifier bank 104-1 is situated on the other side of cell region 102.

A number of channel registers 106-0 to 106-3 are also illustrated in FIG. 1. The channel registers (106-0 to 106-3) are arranged into two groups, with a first group including channel registers 106-0 and 106-1 and a second group including channel registers 106-2 and 106-3. The channel registers (106-0 to 106-3) are coupled to the cell region 102 by a data transfer bus 108.

A data transfer bus 108 can include bus line pairs 110-00/01 and 110-10/11. In the arrangement of FIG. 1, data is placed on bus line pairs (110-00/01 and 110-10/11) by activating one of every four sense amplifiers in a bank (104-0 and 104-1). That is, in each sense amplifier bank (104-0 and 104-1) there are four sense amplifiers for every bus line pair (110-00/01 and 110-10/11). While not set forth in detail in FIG. 1, the sense amplifiers can be connected to the bus line pairs by gate circuits or the like. Examples of such connections will be described with reference to FIGS. 2 and 4.

The sense amplifiers are labelled to identify particular groups of sense amplifiers within each bank (104-0 and 104-1). The sense amplifiers of bank 104-0 are labelled Sa1 to Sa4 and the sense amplifiers of bank 104-1 are labelled Sb1 to Sb4. Each group of sense amplifiers can be associated with a corresponding transfer bus line (110-00/01 and 110-10/11). In the arrangement of FIG. 1, the sense amplifiers can be connected to digit lines, four of which are shown as Da1N, Da1T, Db1N and Db1T. The digit lines can be connected to columns of memory cells within memory cell region 102.

A sense amplifier within a particular group can be selected by an associated sense amplifier select signal. In FIG. 1, the sense amplifiers Sa1–Sa4 can-be selected by sense amplifier select signal SSa1 to SSa4, respectively, and sense amplifiers Sb1–Sb4 can be selected by sense amplifier select signal SSb1 to SSb4, respectively.

Also included in FIG. 1 are switching circuits 112-0 and 112-1 connected to transfer bus line pairs 110-00/01 and 110-10/11 , respectively. Each switching circuit 112-0 and 112-1 can be conceptualized as being associated with cell region 102. Further, each switching circuit 112-0 and 112-1 can be conceptualized as dividing its respective transfer bus line pair (110-00/01 and 110-10/11) in the vertical direction of FIG. 1. As just one example, switching circuit 112-0 may have an "on" state and an "off" state. In the off state, switching circuit 112-0 can divide transfer bus line pair 110-00/01 into an upper bus line pair portion 114-00/01 and a lower bus line pair portion 116-00/01. Transfer bus line pair 110-10/11 can be divided into an upper bus line pair portion 114-10/11 and a lower bus line pair portion 116-10/11 by switching circuit 112-1.

Sense amplifiers from bank 104-0 can be connected to upper bus line pair portions (114-00/01 and 114-10/11) and sense amplifiers from bank 104-1 can be connected to lower bus line pair portions (116-00/01 and 116-10/11). In this way, the first embodiment 100 can transfer two sets of data values by dividing a set of transfer bus lines (110-00 to 110-11) with switching circuits (112-0 and 112-1). In this way, transfer bus lines (110-00 to 110-11) can be shared.

The switching circuits (112-0 and 112-1) are shown to receive a bus division signal SW. The switching circuits (112-0 and 112-1) can provide a high impedance path when turned off and a low impedance path when turned on. One of the many possible configuration for a switch circuit can include two transistors that are turned on and off according to the SW signals. Another of the possible configurations can include a transfer gate having complementary devices, such as two n-channel transistors and two p-channel transistors.

It is noted that the block diagram of FIG. 1 can be conceptualized as including circuit cell portion that is logically arranged into a "bank." The bank structure of FIG. 1 is indicated by the reference character 118.

Figure 2:
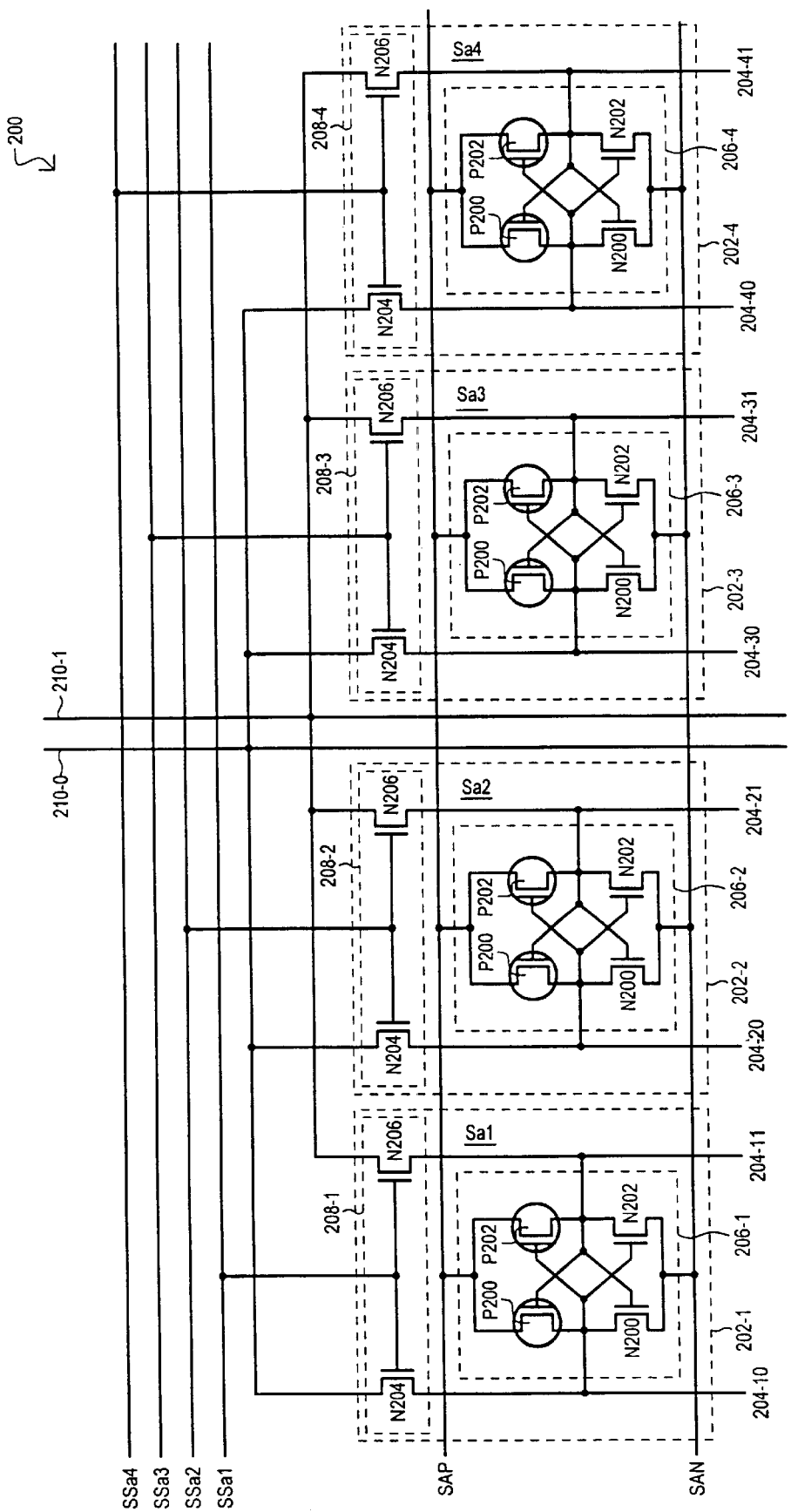
FIG. 2 is a circuit diagram of sense amplifier arrangement that may be used in the semiconductor memory of FIG. 1.

Referring now to FIG. 2, a circuit diagram is set forth illustrating a sense amplifier arrangement that may be used in the first embodiment of FIG. 1. FIG. 2 can be considered to correspond to the four sense amplifiers Sa1 to Sa4 that are associated with transfer bus line pair 110-00/11.

The arrangement of FIG. 2 is designated by the general reference character 200 and is shown to include sense amplifiers 202-1 to 202-4, that can be conceptualized as corresponding to sense amplifiers Sa1 to Sa4. Each sense amplifier (202-1 to 202-4) can receive and amplify input signals on corresponding digit line pairs 204-10/11 to 204-40/41.

In FIG. 2, each sense amplifier (202-1 to 202-4) can include a "flip-flop" section 206-1 to 206-4 and a transfer section 208-0 to 208-4. Each "flip-flop" section 206-1 to 206-4 can include two p-channel metal(conductor)-oxide (insulator)-semiconductor (PMOS) transistors (P200/P202) and two n-channel MOS (NMOS) transistors (N200/N202). The flip-flop sections (206-1 to 206-4) can amplify signals on the digit line pairs (204-10/11 to 204-40/41). Each transfer section (208-1 to 208-4) can include two NMOS transistors N204/N206. Transfer sections 208-1 to 208-4 can be turned on by sense amplifier selection signals SSa1 to SSa4, respectively. When turned on, a transfer section (208-1 to 208-4) can couple its associated digit line pair (204-10/11 to 204-40/41) to a transfer bus line pair 210-0/1.

The sense amplifiers (202-1 to 2024) can be commonly activated by a first enable signal SAP and a second enable signal SAN. One skilled in the art would recognize that the SAN and SAP signals can supply an activating potential that enables the amplifying function of the sense amplifiers.

Figure 3:
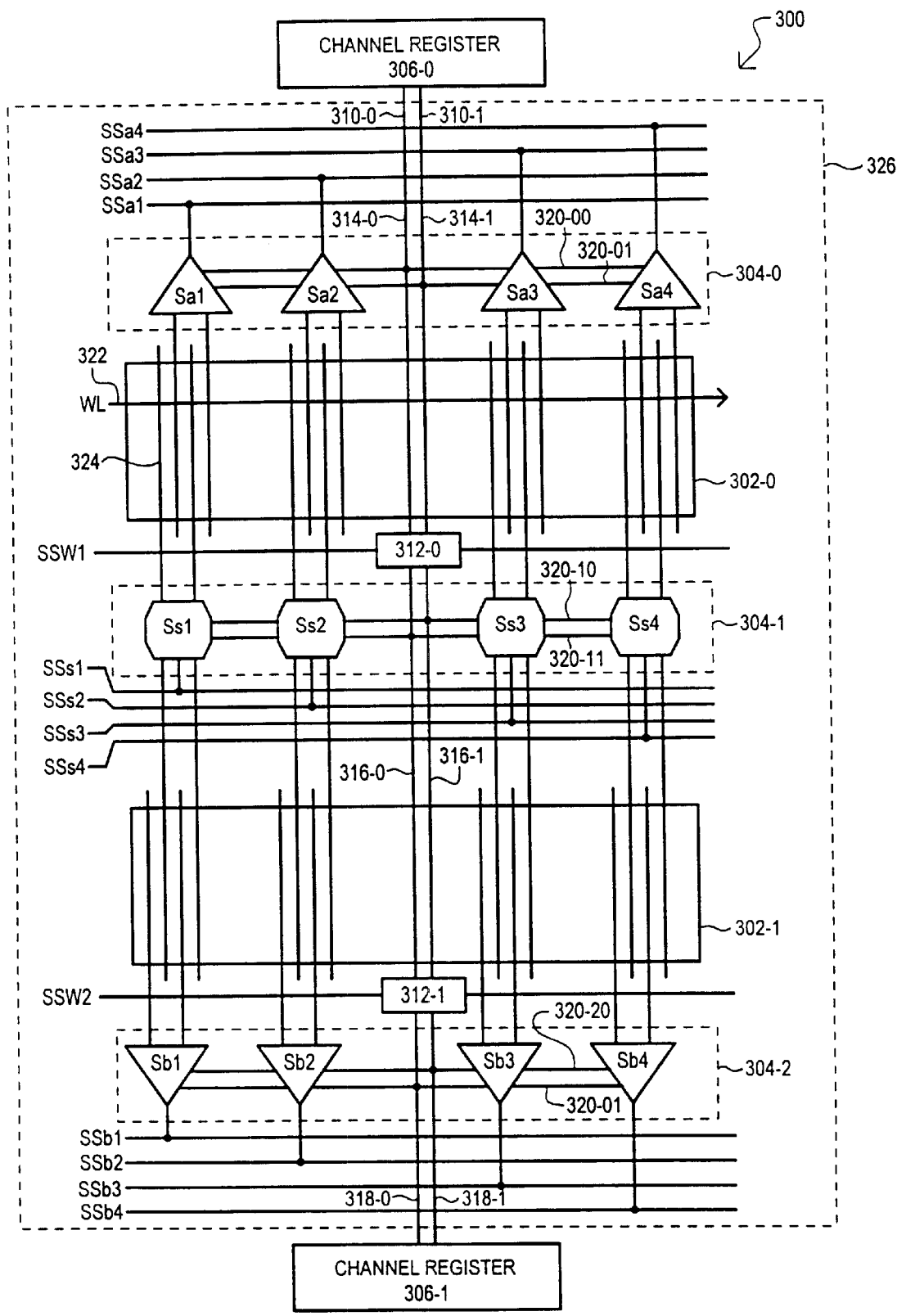
FIG. 3 is a block diagram of a semiconductor memory according to a second embodiment.

Referring now to FIG. 3, a block diagram is set forth of a semiconductor memory according to a second embodiment. The second embodiment is designated by the general reference character 300. The second embodiment 300 can differ from the first embodiment 100 in that it sets forth a more than one cell region and a "common" sense amplifier bank. A common sense amplifier bank can be a sense amplifier bank that is coupled to more than one cell region.

The block diagram of FIG. 3 is shown to include cell regions 302-0 and 302-1, an upper sense amplifier bank 304-0, a middle common sense amplifier bank 304-1, and a lower sense amplifier bank 304-2, and channel registers 306-0 and 306-1. In the view of FIG. 3, channel registers (306-0 and 306-1) are coupled to the cell regions (302-0 and 302-1) by a data transfer bus line pair 310-0/1. The data transfer bus lines 310-0/1 can be divided by the operation of switching circuits 312-0 to 312-1. In the arrangement of FIG. 3, the switching circuits 312-0 to 312-1 can divide the data transfer bus lines 310-0/1 into an upper transfer bus portion 314-0/1, a middle transfer bus portion 316-0/1 and a lower transfer bus portion 318-0/1. Switching circuits 312-0 and 312-1 are controlled by bus division signals SSW1 and SSW2, respectively.

The sense amplifiers of common sense amplifier bank 304-1 are shared by cell regions 302-0 and 302-1. Within the sense amplifier banks (304-0 to 304-2), the sense amplifiers can be conceptualized as being arranged into groups that are coupled to the data transfer bus lines 310-0/1. The sense amplifier group of bank 304-0 are labelled Sa1 to Sa4, the sense amplifier group of bank 304-1 are labelled Ss1 to Ss2, and the sense amplifier group of bank 304-2 are labelled Sb1 to Sb4. A sense amplifier within each group can be selected according to sense amplifier select signals. In particular, sense amplifiers Sa1 to Sa4 can be selected by sense amplifier select signals SSa1 to SSa4, respectively, sense amplifiers Ss1 to Ss4 can be selected by sense amplifier select signals SSs1 to SSs4, respectively, and sense amplifiers Sb1 to Sb4 can be selected by sense amplifier select signals SSb1 to SSb4, respectively.

Data provided by a selected sense amplifier can be connected to a data transfer bus line pair by wiring structures. In particular, the sense amplifiers of banks 304-0 to 304-2 can be coupled to the data transfer bus line pair 310-0/1 by wiring line pairs 320-00/01 to 320-20/21, respectively.

An example of the operation of the second embodiment 300 will now be described. The operation includes the selection of a word line 322 within cell region 302-0. Bus division signals SSW1 and SSW2 can be turned on, and the transfer bus lines 310-0 and 310-1 set to a predetermined potential. Corresponding to the selection of word line 322, bus division signal SSW1 is turned off. Bus division signal SSW2 can remain on, resulting in transfer bus lines 310-0 and 310-1 being divided into two portions, one portion including upper portion 314-0/1 the other portion including middle and lower portions 316-0/1 and 318-0/1.

The operation can proceed with the cell region 302-0 outputting cell data onto digit lines, one of which is shown as item 324. Sense amplifiers, selected by sense amplifier selection signals, can amplify the cell data on the digit lines. In the described example, with word line 322 selected, a sense amplifier in sense amplifier bank 304-0 can be selected according to sense amplifier selection signals SSa1 to SSa4, and/or a sense amplifier in sense amplifier bank 304-1 can be selected according to sense amplifier selection signals SSs1 to SSs4.

Data from the selected sense amplifier can be connected to a portion of the transfer bus lines 310-0 and 310-1. For example, if sense amplifier Sa1 is selected, data from the sense amplifier can be connected to an upper transfer line portion (formed by 314-0/1) through wiring line pair 320-00/01. If common sense amplifier Ss1 is selected, data from the sense amplifier can be connected to a lower transfer line portion (formed by 316-0/1 and 318-0/1) through wiring line pair 320-10/11.

When a word line 322 in cell region 302-0 is selected, sense amplifier select signals SSb1 to SSb4 can be deselected to avoid applying data from two cell regions (302-0 and 302-1) to common transfer line portions (316-0/1 and 318-0/1).

It is noted that the block diagram of FIG. 3 can be conceptualized as including a circuit cell portion that is logically arranged into a "bank." The bank structure of FIG. 3 is indicated by the reference character 326, and is shown to include multiple cell portions.

As shown by FIG. 3, the second embodiment can include multiple cell regions that can be accessed by a dividable transfer bus and a bank of common sense amplifiers.

Figure 4:
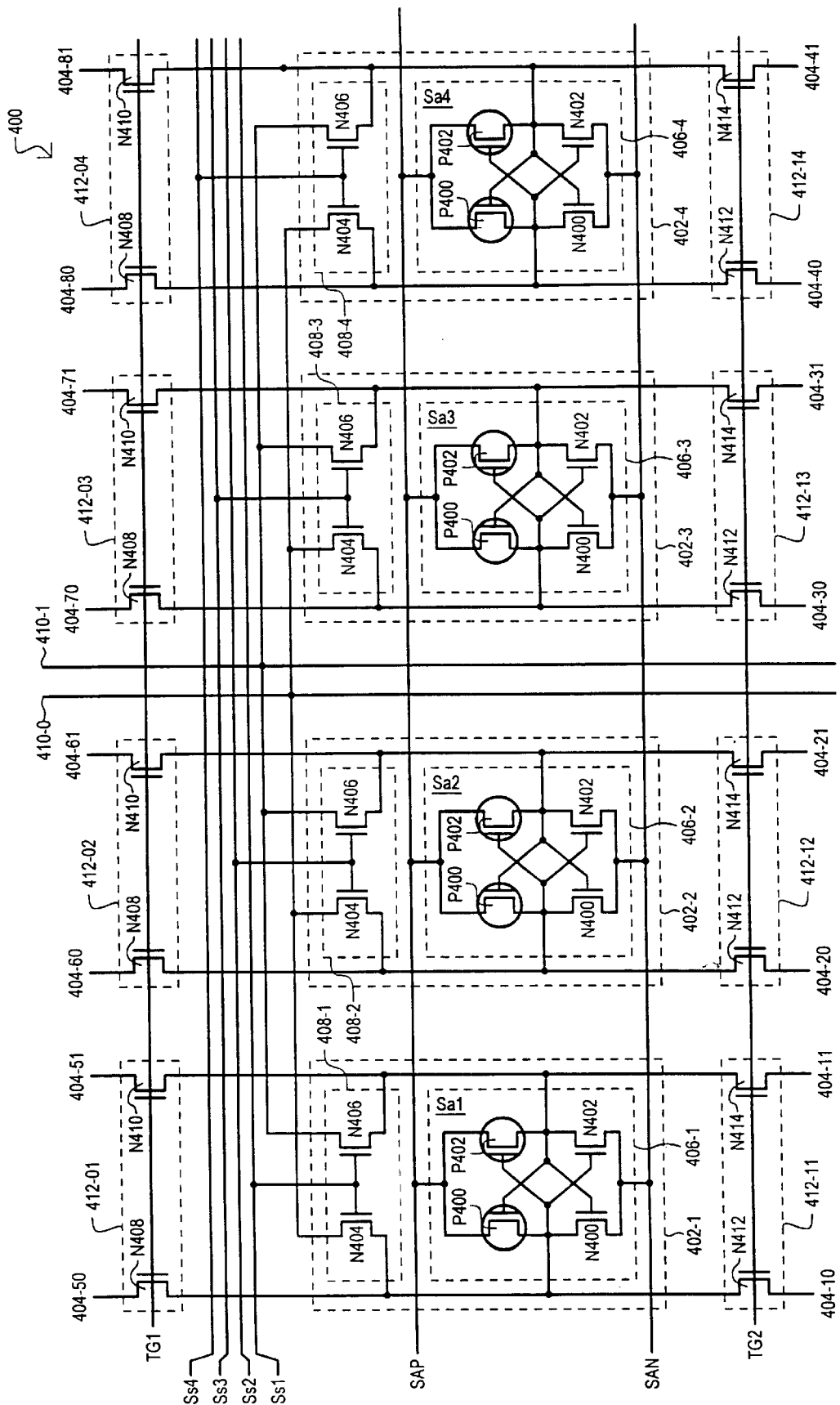
FIG. 4 is a circuit diagram of sense amplifier arrangement that may be used in the semiconductor memory of FIG. 3.

Referring now to FIG. 4, a circuit diagram is set forth illustrating a sense amplifier arrangement that may be used in the second embodiment of FIG. 3. FIG. 4 can be considered to correspond to the four common sense amplifiers Ss1 to Ss4 set forth in FIG. 3.

The arrangement of FIG. 4 is designated by the general reference character 400 and is shown to include sense amplifiers 402-1 to 402-4, that can be conceptualized as corresponding to sense amplifiers Ss1 to Ss4. Each sense amplifier (402-1 to 402-4) can receive and amplify input signals on digit line pairs 404-10/11 to 404-40/41 associated with one cell region, and digit line pairs 404-50/51 to 404-80/81 associated with another cell region.

Each sense amplifier (402-1 to 402-4) can include a "flip-flop" section 406-1 to 406-4 and a transfer section 408-1 to 408-4. Each "flip-flop" section 406-1 to 406-4 can include two PMOS transistors (P400/P402) and two NMOS transistors (N400/N402). The flip-flop sections (406-1 to 406-4) can amplify signals on the digit line pairs (404-10/11 to 404-40/41 or 404-50/51 to 404-80/81). The sense amplifiers (402-1 to 402-4) can be commonly activated by sense amplifier select signals SAN and SAP.

Each transfer section (408-1 to 408-4) can include two NMOS transistors N404/N406. Transfer sections 408-1 to 408-4 can be turned on by sense amplifier selection signals SSsl to SSs4, respectively. When turned on, a transfer section (408-1 to 408-4) can couple its associated digit line pair (404-10/11 to 404-80/81) to a transfer bus line pair 410-0/1.

The arrangement of FIG. 4 further includes first transfer gates 412-01 to 412-04 and second transfer gates 412-11 to 412-14. First transfer gates (412-01 to 412-04) can connect digit line pairs 404-50/51 to 404-80/81 to sense amplifiers 402-1 to 402-4. First transfer gates (412-01 to 412-04) can include two NMOS transistors N408 and N410 that are controlled by a transfer gate signal TG1. Second transfer gates (412-11 to 412-14) can connect digit line pairs 404-10/11 to 404-40/41 to sense amplifiers 402-1 to 402-4. Second transfer gates (412-11 to 412-14) can include two NMOS transistors N412 and N414 that are controlled by a transfer gate signal TG2.

Figure 5:
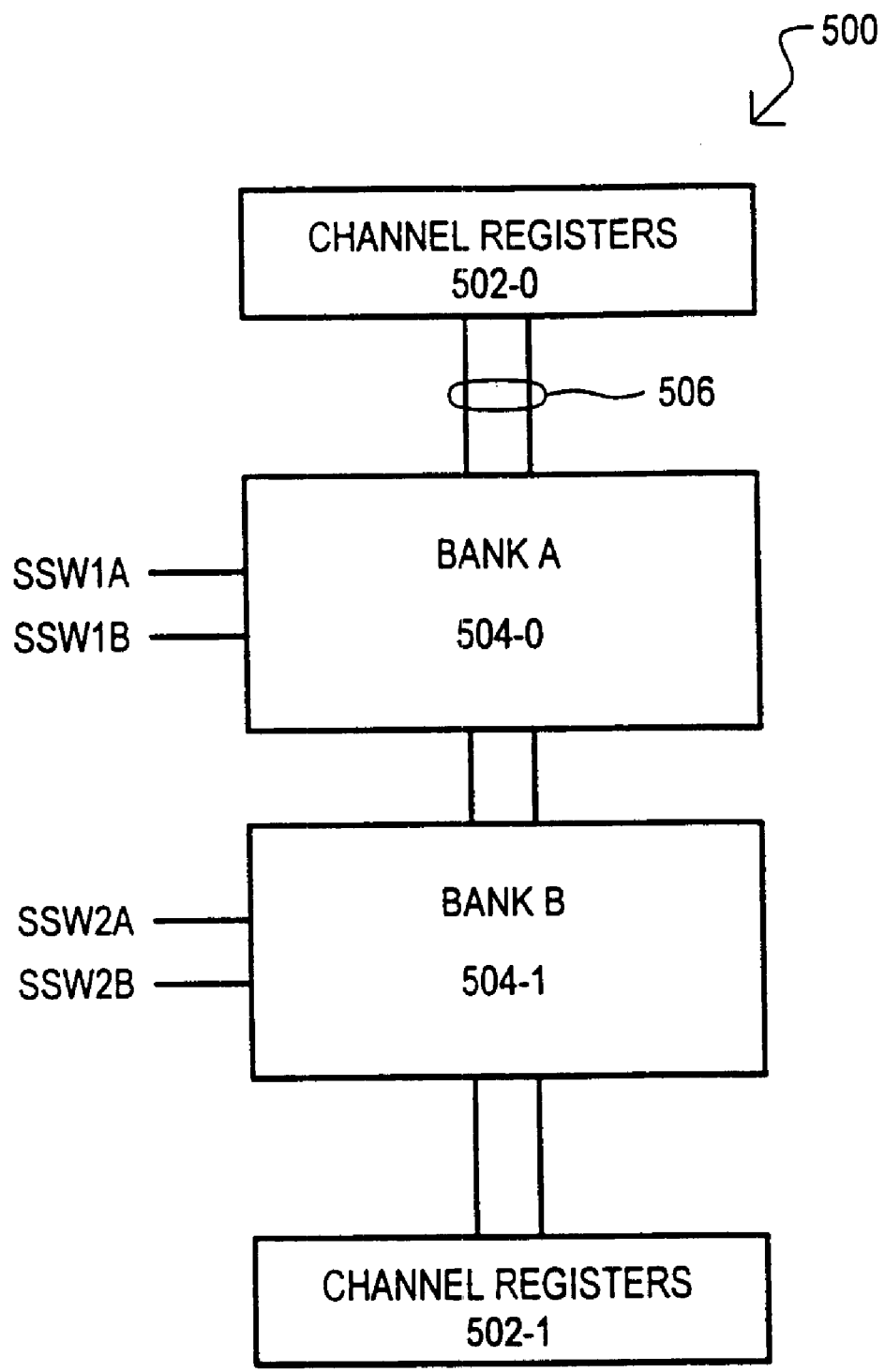
FIG 5 is a block diagram of a semiconductor memory according to a third embodiment.
Figure 6:
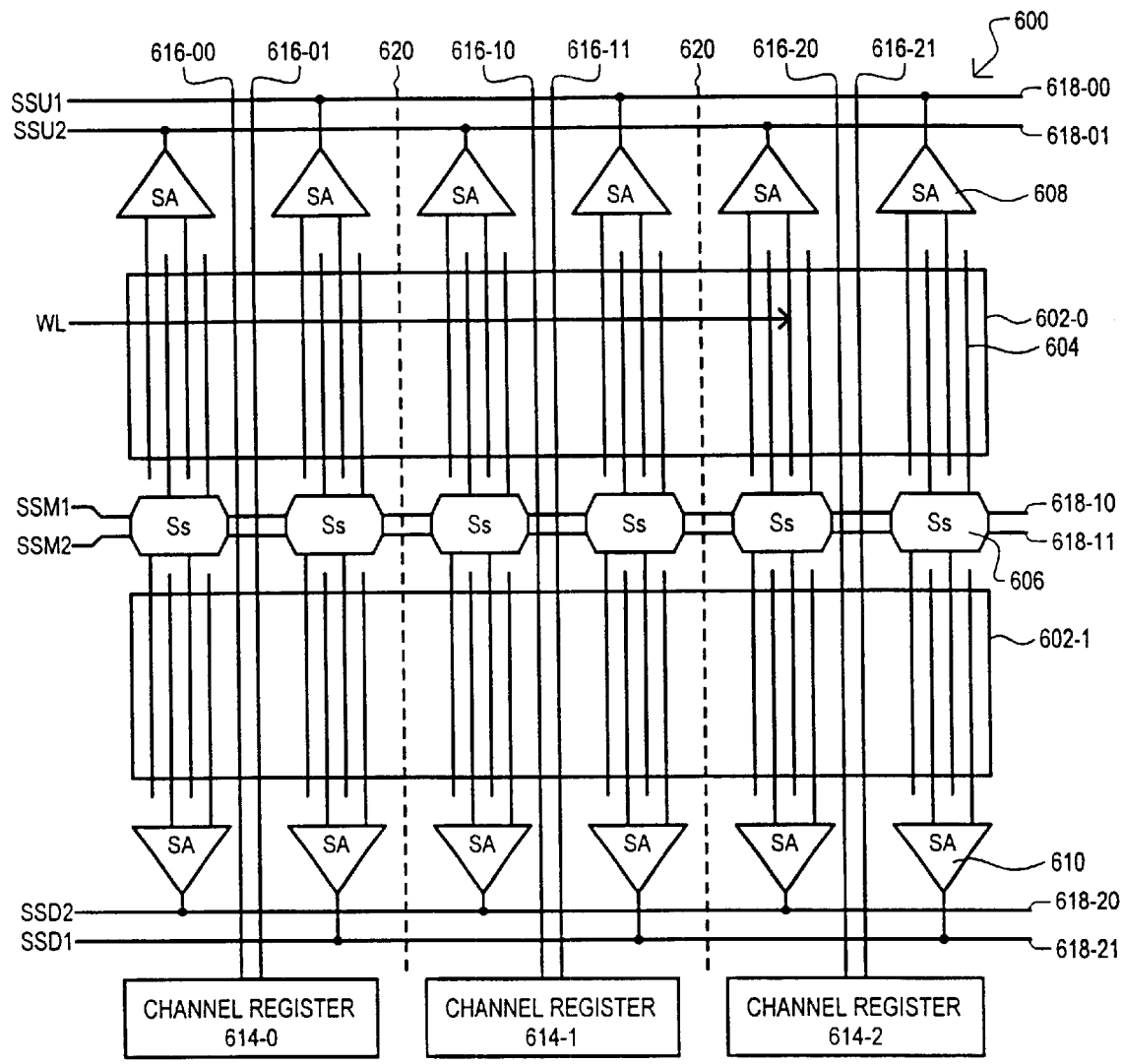
FIG. 6 is a block diagram of a virtual channel synchronous dynamic random access memory (VCSDRAM).

FIG. 5 is a block diagram of a semiconductor memory device according to a third embodiment. The third embodiment is designated by the general reference character 500, and can differ from the first and second embodiments (100 and 300) in that it includes a plurality of banks.

Referring now to FIG. 5, the third embodiment 500 is shown to include a first register group 502-0, a second register group 502-1, a first bank (BANK A) 504-0, and a second bank (BANK B) 504-1. A data transfer bus 506 can connect first and second banks (504-0 and 504-1) to first and second register groups (502-0 and 502-1).

The banks (such as 504-0 and 504-1) of the third embodiment 500, as just two examples, can have structures like those of the first embodiment bank 118 and/or the second embodiment bank 326.

It is understood that in one particular arrangement, that the data transfer bus 506 can be separated into portions according to switching circuits within the banks. In the arrangement of FIG. 5, switching circuits within the first bank 504-0 can be controlled by bus division signals SSW1A and SSW1B. Switching circuits within the second bank 504-1 can be controlled by bus division signals SSW2A and SSW2B.

In particular, switching circuits can divide the data transfer bus according to a prefetch or restore signal received from a memory controller. A prefetch or restore signal can direct data transfers between channel registers (within register groups 502-0 and 502-1) and sense amplifiers (within banks 504-0 and 504-1).

Operations for one version of the third embodiment will now be described in conjunction with FIGS. 3 and 5. For the purposes of this description it is assumed that the third embodiment 500 includes a bank having the structure of the second embodiment 326.

When a memory cell is not selected, switching circuits (such as 312-0 and 312-1) are turned on, and the data transfer bus 506 is set to a predetermined potential. A word line can be selected (such as 322) and data can be amplified by sense amplifier banks (304-0 and 304-1) situated at opposing ends of the cell region 302-0 containing the selected word line 322. Amplification of sense amplifier data can be accomplished by sense amplifier enable signals such as SAP and SAN.

The bus division signals SSW1A, SSW1B, SSW2A and SSW2B can be deselected at this time, dividing the transfer bus 506 into a number of sections. Further, sense amplifier select signals (such as SSs1 to SSs4) are also deselected.

A control signal can then be received from an external controller to initiate a data transfer between a bank (504-0 and 504-1) and the register groups (502-0 and 502-1). In the event a word line has been selected within first bank 504-0, bus division signal SSW1A can be turned off, while bus division signal SSW1B can be turned on. Further, the bus division signals associated with the second bank 504-1 (SSW2A and SSW2B) can be turned on. In this way, the data transfer bus 506 can be divided into one portion coupled to a first register group 502-0 and another portion coupled to a second register group 502-1.

In this way, memory cell data can be accessed in a bank (504-0 and 504-1), and then transferred via a divided data transfer bus 506 to first and second register groups (502-0 and 502-1).

It is noted that in the cases of the first and second embodiments (100 and 300), the switching circuits (such as 112-0 and 112-1 and 312-0 and 312-1) can divide a transfer bus (110-00 to 110-11 and 310-0/310-1) in response to the selection of a word line.

The third embodiment 500 can differ from the first and second embodiments (100 and 300) in that the data transfer bus 506 can be divided by switching circuits in response to a prefetch or restore signal that can initiate a data transfer between register groups (502-0 and 502-1) and banks (504-0 and 504-1). For example, if an arrangement such as that of FIG. 5 includes data transfer bus division according to word line selection, word lines may be selected in both banks at the same time. In such a case, the data transfer bus could be divided into three portions, preventing the desired data from being transferred to the register groups (502-0 and 502-1).

Accordingly, by dividing the data transfer bus 506 in response to a prefetch or restore signal, a switching circuits within one bank can be turned off, while those in another bank can be turned on. For example, if a transfer is to occur between the first bank 504-0 and register groups 504-0 and 504-1, a set of switching circuits within first bank 504-0 can be turned off by deselecting the SSW1A or SSW1B signal. At the same time the SSW2A and SSW2B signals can be selected. In this arrangement, data in the first bank 504-0 can be transferred to both channel registers (502-0 and 502-1).

It is understood that while various descriptions have described accesses to the first bank 504-0, similar accesses can occur to the second bank 504-1.

As described in the various embodiments, a semiconductor memory according the present invention can advantageously reduce the number of transfer bus lines while maintaining data transfer speeds of a virtual channel memory. Such a semiconductor memory device may be advantageously employed in image processing applications.

It is also noted that while the various arrangements have illustrated sense amplifier arrangements having a ratio of 4:1 with respect to corresponding channel registers, such a configuration should not be construed as limiting the invention thereto.

The particular arrangement of memory device components can also be subject to variation. As but one example, while the switching circuits (112-0 and 112-1) of FIG. 1 are illustrated as being situated between sense amplifier bank 104-1 and cell region 102, one or all of such switching circuits (112-0 and 112-1) can be situated at various locations between sense amplifier banks 104-0 and 104-1.

It is further understood that while the various figures have illustrated arrangements that include a limited number of data transfer lines, many such lines can be arranged in parallel to form a larger bus structure.

The present invention has been described in conjunction with a number of embodiments. However, a semiconductor memory of the present invention should not be construed as being restricted to such embodiments. Various modifications to the disclosed embodiments are included in the range of the present invention. As just one example, a semiconductor memory of the present invention is not limited to a virtual channel memory, but can also be employed in a general-purpose memory.

It is thus understood that while various particular embodiments set forth herein have been described in detail, the present invention could be subject to various changes, substitutions, and alterations without departing from the spirit and scope of the invention. Accordingly, the present invention is intended to be limited only as defined by the appended claims.

What is claimed is:

1. A semiconductor memory, comprising:
a first memory cell region including a plurality of first memory cells;
a second memory cell region including a plurality of second memory cells;
a first data transfer line;
a second data transfer line;
a third data transfer line;
a set of first sense amplifier circuits coupled to said first data transfer line and provided for a part of said first memory cells;
a set of second sense amplifier circuits coupled to said second data transfer line and provided for another part of said first memory cells and part of said second memory cells;
a set of third sense amplifier circuits coupled to said third data transfer line and provided for another part of said second memory cells;
a first switch circuit coupled between said first and second data transfer lines that electrically connects the first and second data transfer lines when turned on; and
a second switch circuit coupled between said second and third data transfer lines that electrically connects the second and third data transfer lines when turned on.

2. The semiconductor memory of claim 1, wherein:
said first memory cell region has first and second sides that oppose each other;
said second memory cell region has third and fourth sides that oppose each other;
the set of first sense amplifier circuits being arranged along the first side;
the set of second sense amplifier circuits and first switch being arranged between the second and third sides; and
the set of third sense amplifier circuits and second switch being arranged along the fourth side.

3. The semiconductor memory of claim 1, wherein:
said semiconductor memory has an operating mode in which said first switch is off and said second switch is on when said first memory cell region is selected so that a data access operation is performed through said first data transfer line on at least one memory cell in the part of said first memory cells, and another data access operation is performed through said second and third data transfer lines on at least one memory cell in the other part of said first memory cells.

4. The semiconductor memory of claim 1, further including:
a first data input/output (I/O) circuit coupled to said first data transfer line and a second data I/O circuit coupled to said third data transfer line.

5. The semiconductor memory of claim 4, wherein:
each of said first and second data I/O circuits comprises a channel register.

6. The semiconductor memory of claim 2, wherein:
the set of first sense amplifier circuits includes at least two sense amplifiers arranged on either side of said first data transfer line;
the set of second sense amplifier circuits includes at least two sense amplifiers arranged on either side of said second data transfer line; and
the set of third sense amplifier circuits includes at least two sense amplifiers arranged on either side of said third data transfer line.

7. The semiconductor memory of claim 1, wherein:
the first, second and third data transfer lines each comprise complementary data lines.

8. The semiconductor memory of claim 1, wherein:
the sets of first, second and third sense amplifier circuits include sense amplifiers coupled to complementary digit line pairs.

9. The semiconductor memory of claim 8, wherein:
each sense amplifier comprises
a flip-flop section that amplifies data values on the digit line pair, and
a transfer section that couples the flip-flop section to the digit line pair.

10. The semiconductor memory of claim 9, wherein:
the flip-flop section comprises a first pair of transistors of opposite conductivity types cross coupled with a second pair of transistors of opposite conductivity types.

11. The semiconductor memory of claim 9, wherein:
the transfer section comprises a pair of transistors.

12. A semiconductor memory, comprising:
a first data transfer bus portion coupled to a first sense amplifier bank;
a second data transfer bus portion coupled to a second sense amplifier bank that is shared between two different memory cell regions;
a third data transfer bus portion coupled to a third sense amplifier bank;
a first switching circuit that couples the first transfer bus portion to the second transfer bus portion in an on state, and isolates the first transfer bus portion from the second transfer bus portion in an off state; and
a second switching circuit that couples the second transfer bus portion to the third transfer bus portion in an on state, and isolates the second transfer bus portion from the third transfer bus portion in an off state.

13. The semiconductor memory of claim 12, wherein:
the first sense amplifier bank is coupled to a first memory cell region;
the second sense amplifier bank is coupled to the first memory cell region and a second memory cell region; and
the third sense amplifier bank is coupled to the second memory cell region.

14. The semiconductor memory of claim 12, wherein:
when the first and second switching circuits are placed in different states one memory cell from a selected memory cell region is accessed by one of the data transfer bus portions, while another memory cell from the selected memory cell region is accessed by the remaining two of the data transfer bus portions.

15. The semiconductor memory of claim 14, wherein:
the first sense amplifier bank is coupled to a first memory cell region;
the second sense amplifier bank is coupled to the first memory cell region and a second memory cell region;
the third sense amplifier bank is coupled to the second memory cell region; and
when the first and second switching circuits are placed in different states at least one sense amplifier from two of the three sense amplifier banks is activated, and the sense amplifiers of the remaining sense amplifier bank are deactivated.

16. The semiconductor memory of claim 12, further including:
   a first channel register coupled to the first data transfer bus portion for transferring data between the first channel register and the first or second sense amplifier bank; and
   a second channel register coupled to the third data transfer bus portion for transferring data between the second channel register and the second or third sense amplifier bank.

17. A semiconductor memory, comprising:
   a first channel register
      coupled to a first memory cell region by a first data transfer bus portion in a first configuration, and
      coupled to a second memory cell region by the first data transfer bus portion and a second data transfer bus portion in a second configuration; and
   a second channel register
      coupled to the first memory cell region by the second data transfer bus portion and a third data transfer bus portion in the first configuration, and
      coupled to the second memory cell region by the third data transfer bus portion in the second configuration.

18. The semiconductor memory of claim 17, further including:
   a first sense amplifier bank coupled to the first memory cell region;
   a second sense amplifier bank coupled to the first and second memory cell regions;
   a third sense amplifier bank coupled to the second memory cell region;
   in the first configuration the first data transfer bus portion is coupled to the first memory cell region by the first sense amplifier bank and the second data transfer bus portion is coupled to the first memory cell region by the second sense amplifier bank; and
   in the second configuration the third data transfer bus portion is coupled to the second memory cell region by the third sense amplifier bank and the second data transfer bus portion is coupled to the second memory cell region by the second sense amplifier bank.

19. The semiconductor memory of claim 18, wherein:
   the first sense amplifier bank includes at least one sense amplifier disposed on opposite sides of the first data transfer bus portion;
   the second sense amplifier bank includes at least one sense amplifier disposed on opposite sides of the second data transfer bus portion; and
   the third sense amplifier bank includes at least one sense amplifier disposed on opposite sides of the third data transfer bus portion.

20. The semiconductor memory of claim 17, further including:
   a first switch circuit that isolates the first transfer bus portion from the second transfer bus portion in the first configuration and couples the first transfer bus portion to the second transfer bus portion in the second configuration; and
   a second switch circuit that couples the second transfer bus portion to the third transfer bus portion in the first configuration and isolates the second transfer bus portion from the third transfer bus portion in the second configuration.

* * * * *